Figure 1:
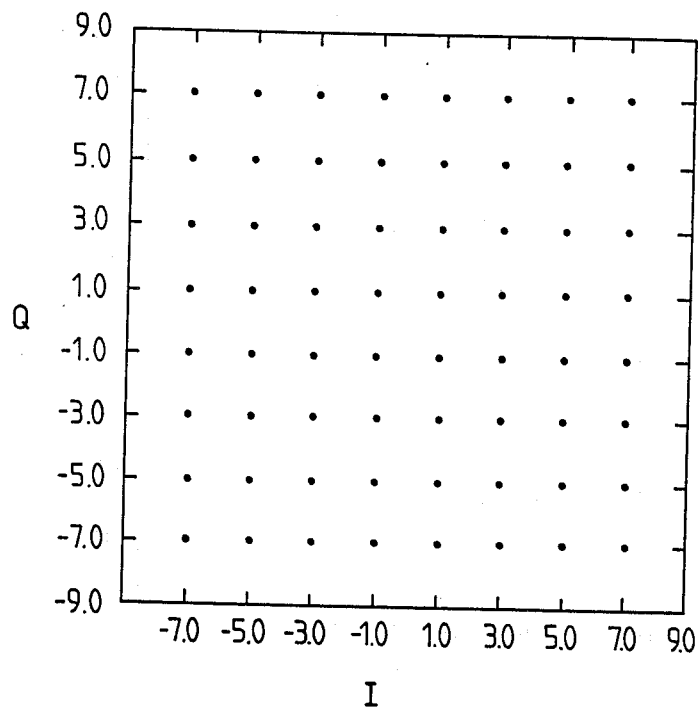

United States Patent [19]
Sari

[11] Patent Number: 4,967,164
[45] Date of Patent: Oct. 30, 1990

[54] ADAPTIVE PREDISTORTION CIRCUIT

[75] Inventor: Hikmet Sari, Creteil, France

[73] Assignee: U. S. Philips Corporation, New York, N.Y.

[21] Appl. No.: 407,380

[22] Filed: Sep. 14, 1989

[30] Foreign Application Priority Data

Sep. 30, 1988 [FR] France .................... 88 12805

[51] Int. Cl.$^5$ ............................. H03F 1/26
[52] U.S. Cl. .................... 330/149; 330/151
[58] Field of Search ........... 328/162, 163; 330/126, 330/149, 151, 302, 306; 332/159, 160

[56] References Cited

U.S. PATENT DOCUMENTS 4,291,277 9/1981 Davis et al. .................. 330/149
4,879,519 11/1989 Myer ............................ 330/149

*Primary Examiner*—Steven Mottola
*Attorney, Agent, or Firm*—Jack D. Slobod

[57] ABSTRACT

An adaptive predistortion circuit for a digital transmission system which comprises a predistortion circuit ($52_1$, $52_2$) predistorting the input data prior to their entering a modulator (56) and thereafter an amplifier (57), and an adaptation circuit ($61_1$, $61_2$) continuously adapting the predistortion circuit to the stream of transmitted data in response to a demodulation of the stream of transmitted data. The predistortion circuit further comprises an encoder (51) which, on the basis of digital data $a_k$, generates on a first path digital data $b_k$ which leave a first predistortion circuit ($52_1$) in a predistorted manner and in-phase with the symbol clock, and on a second path digital data $c_k$ which leave a second predistortion circuit ($52_2$) in a predistorted manner and in phase-opposition to the symbol clock. The signals $b_k$ and $c_k$ are obtained by means of a polynomial encoding. The encoding may be effected with the aid of shift registers ($62_1 \ldots 62_I$) addressing a memory.

3 Claims, 7 Drawing Sheets

ADAPTIVE PREDISTORTION CIRCUIT

The invention relates to an adaptive predistortion circuit for a digital transmission system which transmits input data at the rate of a symbol clock having a period T with the aid of a modulator and a power amplifier which distorts the data, the circuit comprising:
- a predistortion circuit predistorting in the opposite sense the input data prior to their entering the amplifier in order to transmit the expected input data,
- an adaptation circuit continuously adapting the predistortion circuit to the stream of transmitted data in response to a demodulation of the stream of transmitted data,
- and a filter performing a signal shaping.

The invention finds its applications in the digital transmission systems such as the data transmission modems, radio relay links, space communications systems.

For an efficient use of the available spectrum the current digital transmission systems, specifically the radio relay links and the systems for transmitting data over the telephone channel, use modulation methods with large numbers of phase and amplitude states. These modulations methods are very sensitive to all types of distortion, and of course to non-linear distortions caused by amplifiers, mixers and other non-linear circuits in the transmission chain. A particularly critical point with respect to radio relay links and satellite transmission is the non-linearity of the transmitter power amplifier or the on-board power amplifier in the case of satellite transmissions. These amplifiers are known for their non-linear characteristics. If they are used in their linear zone, the full extent of their power is not utilized. If they are made to operate near to their saturation power level, they will distort the signal in an unacceptable manner. In practice, for a given power amplifier, one fixes the level of the transmitted signal such as to establish a compromise between the signal-to-noise ratio and the non-linear distortion undergone by the signal. Thus the optimum operating point of the amplifier is the one at which the joint effects of the additive noise of the channel and of the non-linear distortion of the amplifier are minimized. For modulation methods with a large number of states (64-QAM and 256-QAM, for example), this point is remote from the saturation power level of the amplifier, which implies that the latter is not used efficiently. In order to enhance its efficiency, predistortion techniques (fixed or adaptive) are currently used which allow of reducing the effect of the non-linearity of the power amplifier on the transmitted signal.

A currently used predistortion technique consists of inserting in the intermediate frequency stage of the transmitter a non-linear circuit realizing an approximation of the inverse function of the power amplifier whose non-linearities one seeks to compensate. If the exact inverse of the function of the amplifier could be synthesized, this technique would permit of having a perfect signal at the output (without any non-linear distortion). However, this cannot be realized because the exact inverse would require a circuit of infinite complexity. In practice one is satisfied with making an approximation and in most cases the Taylor series representing the non-linear function of the amplifier is limited to the third order and a predistortion circuit is synthesized, also of the third order, in a manner such that the two cascaded circuits no longer have third-order distortion. Higher-order terms (fifth order and seventh order) appear at the output but have smaller amplitudes compared to the initial third-order distortion. The result is then a certain improvement of the performance of the system. A disadvantage of these predistortion circuits in the intermediate frequency stage resides in the fact that they are analog circuits. They are hard to make adaptive and require from time to time an intervention to readjust them and compensate for the variations of the amplifier response according to time and temperature.

Another more recent predistortion technique consists of modifying the alphabet of data to be transmitted. This technique called "Data Predistortion" or "Baseband Predistortion" is known from the U.S. Pat. No. 4,291,277 and from the article by A. A. M. SALEH and J. SALZ "Adaptive Linearization of Power Amplifiers in Digital Radio Systems", Bell System Technical Journal, Vol. 62, April 1983, pp. 1019–1033.

In the article by A. A. M. SALEH and J. SALZ, FIG. 1 is a schematic representation of an adaptive predistortion circuit which supplies to the input of the modulator a distorted constellation on the basis of the original square constellation, for example, an amplitude modulation of two quadrature carriers (QAM). The amplifier acts on the constellation by producing a net compression and a net rotation of the points having large amplitudes. In order to compensate for this effect the original constellation is distorted so that it resumes its original square shape after passing through the power amplifier. Thus, when the distortion circuit is optimized, it forms the inverse of the power amplifier (apart from a constant gain and a constant phase shift) and allows of perfectly compensating for the non-linearities of the amplifier. In order to make this circuit adaptive, the signal recaptured at the output of the amplifier, demodulated, then sampled at the symbol transmission rate 1/T and these samples are compared to the points corresponding with the QAM constellation used. These comparisons permit to obtain a control signal which allows of optimizing the predistortion circuit with the aid of a conventional algorithm. However, the scheme used in FIG. 1 is very simplistic for it does not have any filtering before the modulator or before the power amplifier. Thus, it does not correspond with the solution generally used.

Such a system is provided in the U.S. Pat. No. 4,291,277 in which filters occur before the modulator. Actually, in the real systems always a spectral shaping filter of the Nyquist type is used making it possible to limit the bandwidth of the signal whilst guaranteeing a zero intersymbol interference at the decision instants. This filtering is generally equally divided between transmit and receive ends in order to maximize the signal-to-noise ratio also at the decision instants. In such systems there is a twofold effect of the non-linearity of the amplifier: the constellation is not only deformed but intersymbol interference appears associating a cloud of points to each point of the constellation. However, the predistortion technique described in the above Patent does not allow of compensating for this second effect.

It is an object of the invention to realize an adaptive predistortion circuit which allows not only of correcting the constellation but also considerably reducing the dispersion of each point of the original constellation in a cloud of points.

According to the invention, this object is achieved by means of an adaptive predistortion circuit as described in the preamble, characterized in that the circuit comprises an encoder generating, on the basis of digital data $a_k$ (k being an integer):

on a first path, digital data $b_k$ leaving a first predistortion circuit in a predistorted condition, in-phase with the symbol clock, on a second path, digital data $c_k$ leaving a second predistortion circuit in a predistorted condition, in phase-opposition to the symbol clock, the signals $b_k$ and $c_k$ being obtained by means of an n-th order polynomial encoding of the type of $F(D)=(1+D)^n$, where D is a delay of a half symbol period and where F is a function applied to the data $a_k$, these signals having a frequency shaping such that $$F(\omega)=\cos^n(\omega T/4) \text{ for } |\omega| \leq 2\pi/T$$

where n is a positive integer and these signals are encoded such that $$b_k = \sum_{i=0}^{I} C_n^{2i} a_{k-i}$$

$$c_k = \sum_{j=0}^{J} C_n^{2j+1} a_{k-j}$$

where I is the integer part of n/2 and where J is the integer part of (n−1)/2 the coefficients $C_n^{2i}$ and $C_n^{2j+1}$ being the coefficients of Newton's binomial theorem, the predistorted data of the two paths being added together in an adder, then transformed into an analog signal by a digital-to-analog filter, this analog signal being filtered by the filter for obtaining a bandwidth limitation (−1/T, 1/T), then transmitted to the modulator thereafter to the amplifier, the adaptation being effected after the demodulation of the transmitted data with the aid of two adaptation circuits, one of which operating in-phase and the other in phase-opposition to the symbol clock for adapting each of the corresponding predistortion circuit.

In order to effect the polynomial encoding, the encoder may comprise a series of I shift registers in which the data $a_{k-1}, a_{k-2}, \ldots a_{k-I}$ are passing which together with the data $a_k$ are used for addressing at least one memory which performs the encoding of the data $a_k$ into the data $b_k$ and $c_k$, the predistortion circuits being random access memories delivering the predistorted values to the in-phase and the opposite-phase paths.

In the particular case in which n=2, for which $b_k = a_k + a_{k-1}$ and $c_k = 2a_k$, the encoder comprises a single shift register and an adder for determining $b_k$ which addresses the first predistortion circuit, the data $a_k$ directly addressing the second predistortion circuit, the data delivered by the two predistortion circuits entering two sets of flip-flops operating respectively in-phase and in phase-opposition to the symbol clock.

According to the invention a predistortion is effected at the rate of twice the transmission rate of the symbols. Therefore, it is necessary to realize a spectral shaping at the transmit end producing discrete levels at instants separated in time by T/2. First of all it has to be observed that when using a Nyquist filter having an arbitrary roll-off factor $\alpha$ with $0 \leq \alpha \leq 1$, discrete levels are determined at the instants kT, that is to say, at one point per symbol period. The only exception is the Nyquist filter having a roll-off factor of $\alpha = 1$. But in addition to this particular filter there is a whole category of filters having the required property.

These signals are obtained by means of a polynomial encoding of the type:

$$F(D) = \sum_{i=0}^{n} f_i \cdot D^i \quad (1)$$

where D is a delay element delaying by a half symbol-period T/2 and the coefficients $f_i$ are integers, the encoding being followed by an ideal low-pass filtering having a bandwidth of (−1/T, 1/T). The signals thus obtained pass through a finite number of states at any instant kT/2, that is to say, at two points per symbol duration. The polynomials which are in agreement with equation (1) and are the most interesting are those which locate the signal energy at the lower frequencies (so as to minimize adjacent channel interference). The most appropriate polynomials are those which may be expressed in the form:

$$F(D)=(1+D)^n \quad (2)$$

where n is a positive integer. The parameter n (together with the basic alphabet) determines the number of states which can be assumed by the signal at the instants kT and the instants kT+T/2. The parameter n is not to be chosen too large in order to limit this number of states. Such an encoding followed by an ideal low-pass filtering with the bandwidth (−1/T, 1/T) yields:

$$F_e(\omega) = \begin{cases} \cos^n(\omega T/4), & |\omega| \leq 2\pi/T \\ 0, & \text{elsewhere} \end{cases} \quad (3)$$

for the spectrum of the transmitted signal. When n=2, this category of filters provides precisely the Nyquist filtering with a roll-off factor of $\alpha = 1$. The equation (2) can be written in the form:

$$F(D) = \sum_{i=0}^{n} C_n^i D^i \quad (4)$$

where $C_n^i$ are the bionomial theorem coefficients. The associated impulse response is:

$$f(t) = \sum_{i=0}^{n} C_n^i \delta(t - iT/2). \quad (5)$$

If the input signal is:

$$s(t) = \sum_k a_k \delta(t - kT) \quad (6)$$

the output signal of the encoder is:

$$r(t) = \sum_k \left( \sum_{i=0}^{I} C_n^{2i} a_{k-i} \delta(t - kT) + \sum_{j=0}^{J} C_n^{2j+1} a_{k-j} \delta(t - kT - T/2) \right) \quad (7)$$

where I is the integer part of n/2 and J is the integer part of (n−1)/2. The signal r(t) can thus be written in the form of:

$$r(t) = \sum_k \left[ b_k \delta(t - kT) + c_k \delta\left(t - kT - \frac{T}{2}\right) \right] \quad (8)$$

with $b_k = \sum_{i=0}^{I} C_n^{2i} a_{k-i}$ and $c_k = \sum_{j=0}^{J} C_n^{2j+1} a_{k-j}$.

After being low-pass filtered, the signal assumes a finite number of states given by the alphabet of the symbols $b_k$ at the instants kT and a finite number of states given by the alphabet of the symbols $c_k$ at the instants kT+T/2. For n=2 we have $b_k = a_k + a_{k-1}$ and $c_k = 2a_k$. For n=3 we have $b_k = a_k + 3a_{k-1}$ and $c_k = 3a_k + a_{k-1}$.

Thus the proposed shaping filter category at the transmit end (encoding associated to a low-pass filtering) defines two constellations. The signal assumes the levels of one of the constellations at the instants kT and the levels of the other constellation at the instants kT+T/2.

The low-pass filtering following the operation of predistortion at the transmit end is not obliged to approach the ideal low-pass filter so that:

$H(\omega) = |1, \ |\omega| < 2\pi/T$ $|0$ elsewhere

It may have the form:

$$H(\omega) = \begin{cases} 1, \ |\omega| \leq 2(1-\beta)\pi/T \\ 1/2\left[ 1 - \sin\frac{T}{2\beta}(|\omega| - 2\pi/T) \right], \\ \quad 2(1-\beta)\pi/T < |\omega| < 2(1+\beta\pi)/T \\ 0, |\omega| \geq 2(1+\beta)\pi/T \end{cases}$$

where $\beta$ is a roll-off factor with $0 \leq \beta \leq 1$, without doing away with the property of zero-crossing at the instants kT/2 (with the exception of a few values of k) of the impulse response at the transmit end.

Figure 2B:
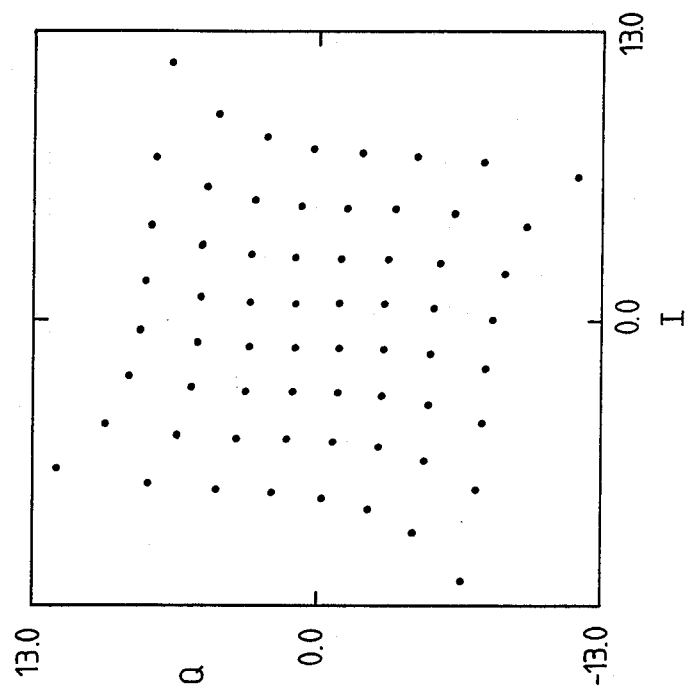
Figure 2A:
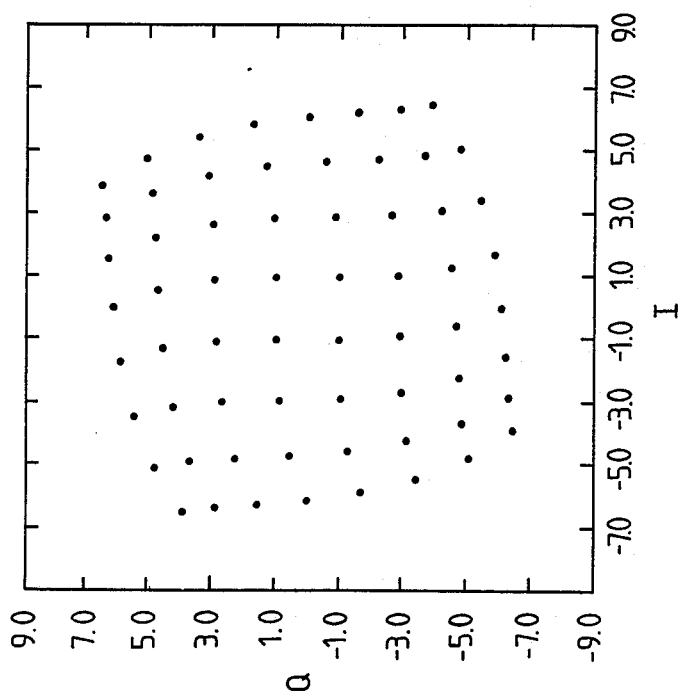
Figures 3A, 3B:
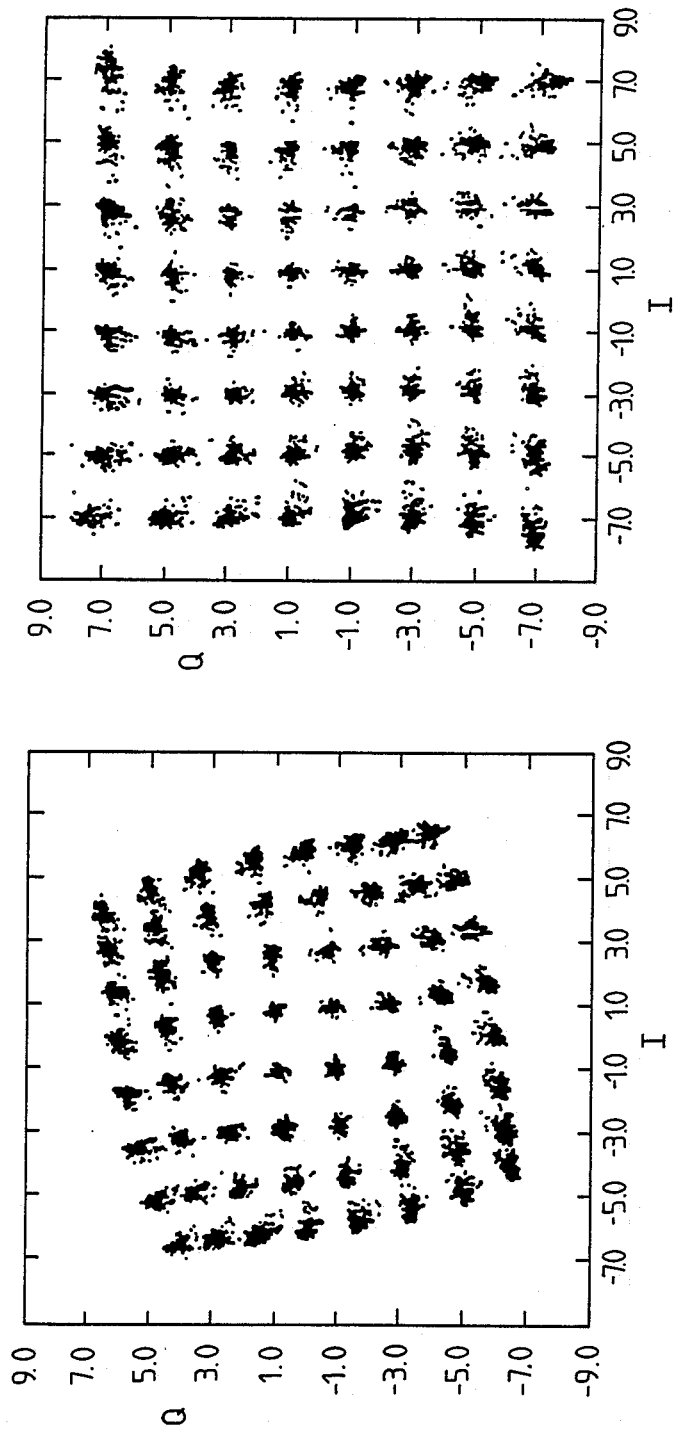
Figure 4A:
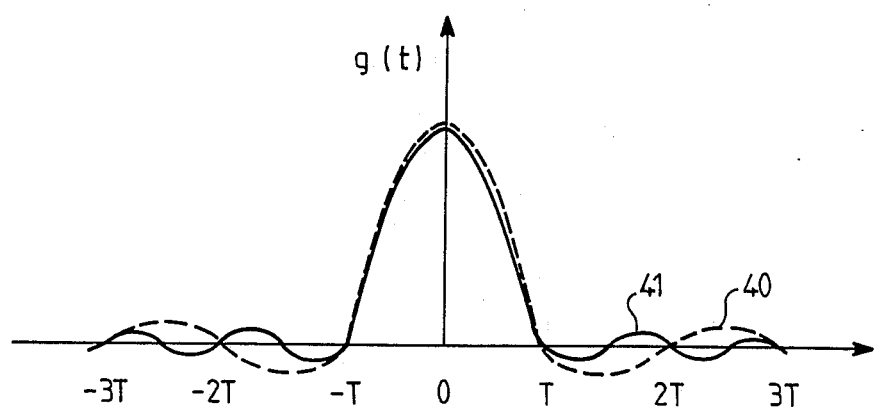
Figure 4B:
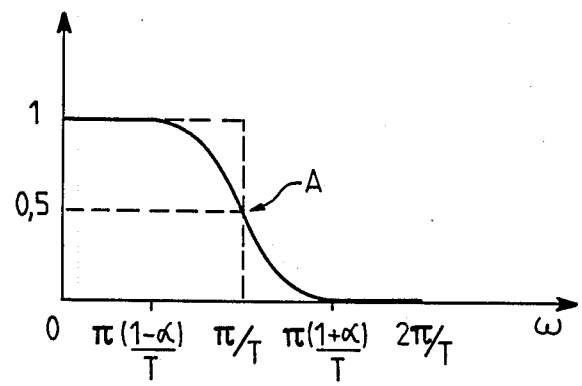
Figure 5:
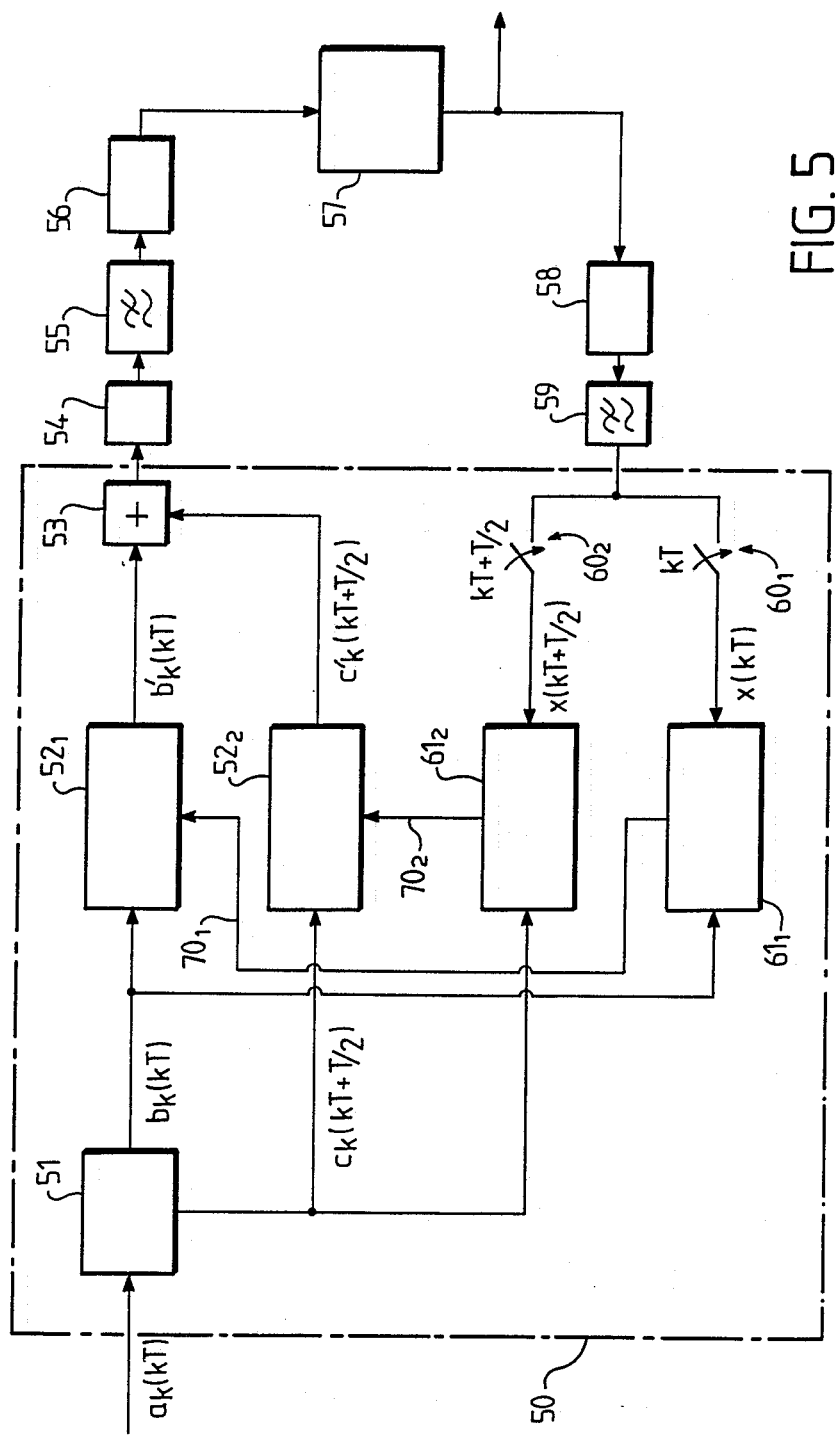
Figure 6:
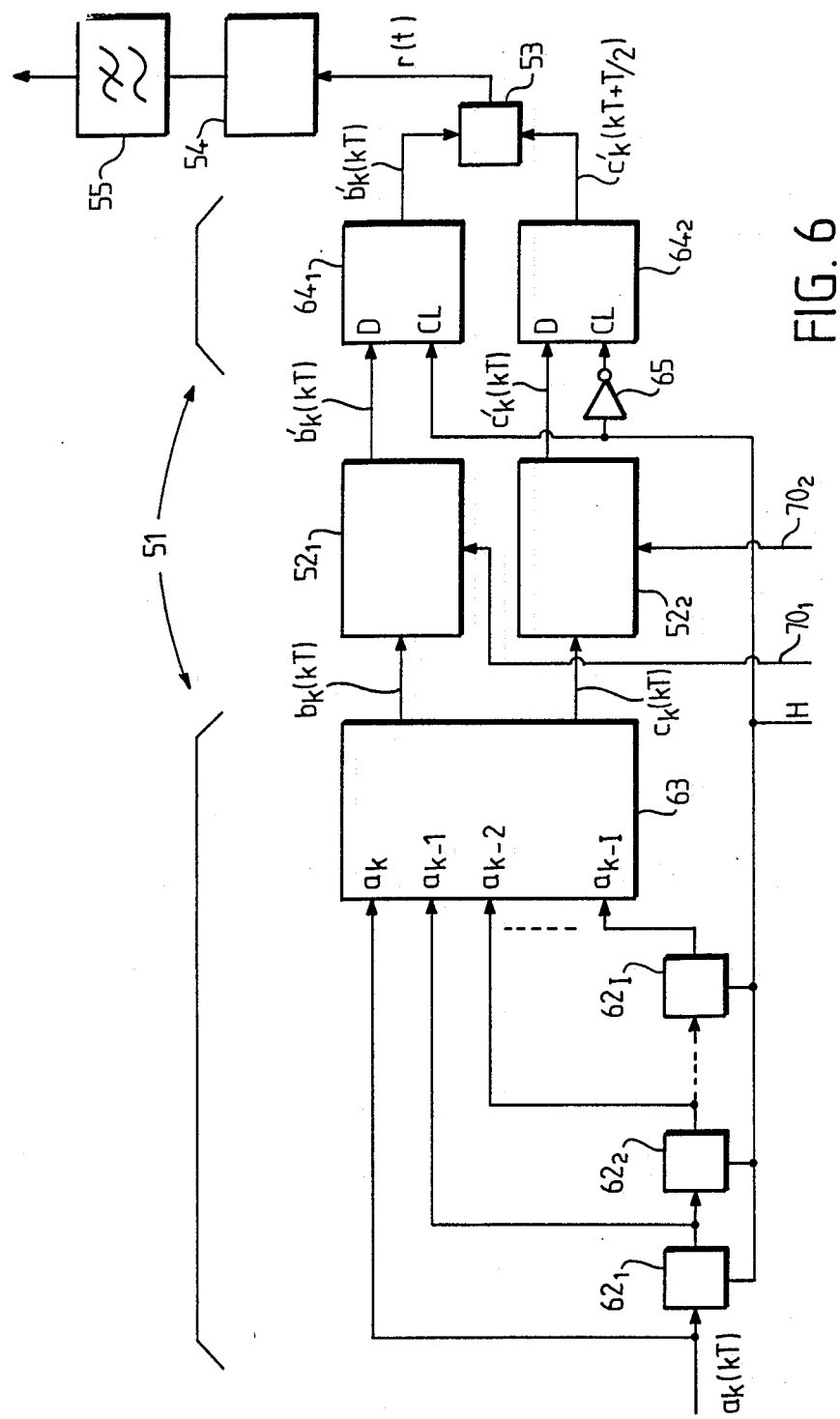
Figure 7:
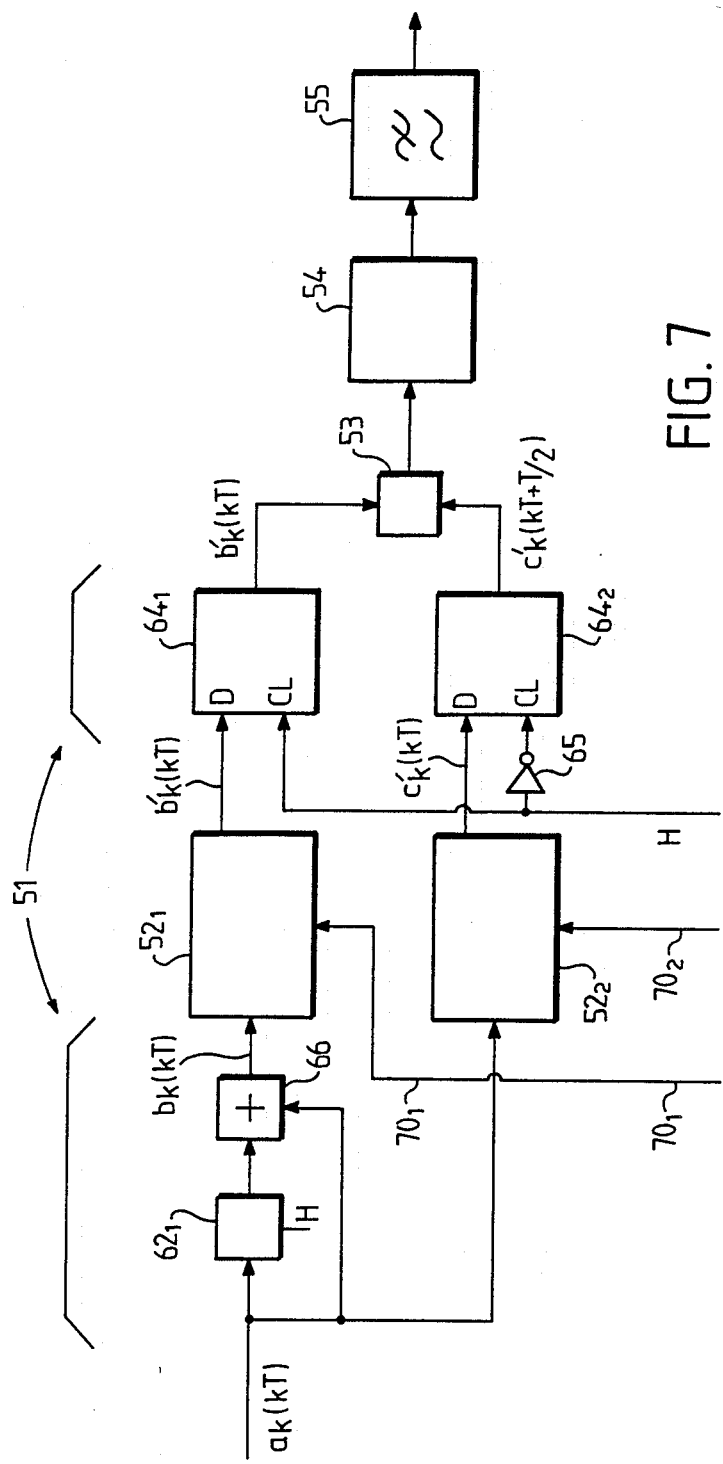

The invention will be better understood with the aid of the following Figures given by way of non-limiting examples and respectively representing in:

FIG. 1: the constellations of a 64-QAM m dulation;

FIG. 2A: a 64-QAM constellation distorted by the power amplifier in a system without filtering or in the case in which all filtering is effected after the amplifier stage;

FIG. 2B: a predistorted constellation optimized for compensating for the distortion illustrated in FIG. 2A according to prior-art techniques;

FIG. 3A: the constellation distorted by the amplifier as it appears when the total filtering is equally divided between the transmit and receive ends and the portion at the transmit end is placed before the amplifier;

FIG. 3B: the distorted constellation with the same situation as with FIG. 3A, but now incorporating the prior-art predistortion circuit;

FIG. 4A: two impulse response curves, one for a Nyquist filter with a roll-off factor $\alpha$ equal to 1 and the other with a roll-off factor different from 1;

FIG. 4B: frequency response of a Nyquist filter (any $\alpha$);

FIG. 5: a basic diagram of an adaptive predistortion circuit according to the invention;

FIG. 6: a detailed diagram of an exemplary embodiment of the encoder;

FIG. 7: a detailed diagram for the case in which n=2;

FIG. 1 is a repetition of the representation of the constellation of a signal of the 64-QAM type. The inputs I (in-phase) and Q (quadrature-phase) of the modulator are independent and the symbols on each channel assume their values in an alphabet (±d, ±3d, ±5d, ±7d), where 2d is the minimum distance between two adjacent points of the constellation.

In order to be transmitted, the signal from the modulator is fed to a power amplifier which is generally used at reduced power, that is, in a linear part of its characteristic. At high power this amplifier is non-linear and distorts the signal in an unacceptable manner. If a constellation of the 64-QAM type is observed at the output of such an amplifier operating near to saturation, a distorted constellation like the one represented in FIG. 2A will be observed. According to the prior art it will than be sufficient to predistort the constellation in the opposite sense according to the diagram of FIG. 2B, so that at the output of the amplifier the non-deformed constellation is obtained. However, so simple a situation is not in conformity with reality where there is always filtering before the power amplifier specifically for limiting the bandwidth of the signal. In the absence of filtering, the signal at the input of the modulator varies in steps once per symbol period T. Then, a predistortion circuit acting on the signal at a rate of 1/T allows of a perfect compensation. In contradistinction therewith, when the signal is filtered, it no longer varies in steps but in a continuous way. For a perfect compensation for the effect of non-linearity it is no longer sufficient to observe the signal once per symbol period T and to compensate for the distortion at these instants.

In the presence of a filtered signal the constellation at the output of the amplifier is represented in FIG. 3A. It becomes the one represented in FIG. 3B with the prior-art predistortion circuit. Thus, each point of the constellation becomes a cloud of points, which is unacceptable. In order to operate with a filtered signal, the correction thus has to be performed for more than one point per symbol period. Therefore, according to the invention, the input signal is subjected to an appropriate encoding in order to form an alphabet at the instants kT and another alphabet at the instants kT+T/2, a predistortion is subsequently separately effected for each of the two alphabets. The resulting signal is then filtered by an ideal low-pass filter having the bandwidth (−1/T, 1/T). According to the invention these cascaded encoding and filtering means have to present an impulse response with zero-crossings at any instant kT/2 with the exception of a few values of the integer k.

The curve 40 of FIG. 4A represents the impulse response of a Nyquist filter having a roll-off factor $\alpha$ different from 1. This curve crosses zero at any instant kT for which k≠0. This kind of shaping is thus not adequate for the predistortion at twice the transmission rate of the symbols. The curve 41 represents the impulse response of a Nyquist filter with $\alpha$=1. This curve crosses zero for additional instants kT+T/2, whilst the values k=0 and k=−1 are to be excluded. FIG. 4B represents the frequency response of a Nyquist filtering. The response is symmetrical with respect to the point A($\frac{1}{2}$T; 0.5) and the excess-bandwidth relative to the Nyquist bandwidth ($\frac{1}{2}$T) is determined by the roll-off factor α. The mathematical expression of the transfer function is:

$$G(\omega) = \begin{cases} 1, & |\omega| \leq (1-\alpha)\pi/T \\ 1/2\left[1 - \sin\frac{T}{2\alpha}(|\omega| - \pi/T)\right], \\ & (1-\alpha)\pi/T < |\omega| < (1+\alpha)\pi/T \\ 0, |\omega| \geq (1+\alpha)\pi/T \end{cases}$$

The Nyquist filtering with α=1 thus appears as a particular case in the category of spectral shaping according to the invention. It is equivalent to a particular encoding in which the parameter n of the equation (2) is equal to 2 followed by an ideal low-pass filtering with the bandwidth of (−1/T, 1/T).

In the general case (but other than in this particular case), the polynomial encoding followed by the low-pass filtering will have a response resembling the curve 41 in the sense that it crosses zero at instants kT/2 but having a shape that may be different.

FIG. 5 represents the portion situated at the transmit end of a digital transmission system comprising an adaptive predistortion circuit 50 according to the invention. It comprises an encoder 51 which, on the basis of data $a_k$, generates data $b_k$ and $c_k$ at the respective instants kT and kT+T/2 encoded according to the invention. The data $b_k$ and $c_k$ enter the predistortion circuits $52_1$, $52_2$ respectively, supplying predistorted data $b'_k$ and $c'_k$ respectively. They are added together in the adder 53. The signal thus obtained passes through a digital-to-analog converter 54, a low-pass filter 55, a modulator 56 and a power amplifier 57 and is then conveyed to a transmit aerial. In order to ensure the adaptation, the output signal of the amplifier 57 is demodulated in a demodulator 58 after which it is filtered in a low-pass filter 59. The output signal of the filter 59 is sampled by two samplers, in the first sampler $60_1$ at the instants kT and in the second sampler $60_2$ at the instants kT+T/2, which samplers supply the samples x(kT) and x(kT+T/2) respectively to two adaptation circuits $61_1$ and $61_2$. The latter circuits compare the samples x(kT) and x(kT+T/2) respectively, with the data $b_k$ and $c_k$. A conventional algorithm is used for calculating, for example, the difference between the two input signals of each adaptation circuit which consequently provides an updating of the predistortion circuits.

The most appropriate method of realizing the predistortion circuits is the use of random access memories (RAM). In such a realisation a RAM will be addressed by the words $b_k$ at the instants kT and its output constitutes the train of predistorted symbols $b'_k$. The other RAM will be addressed by the data $c_k$ at the instants kT+T/2 in order to provide the train $c'_k$. The memories thus contain the predistorted values of the two respective alphabets.

FIG. 6 represents an exemplary embodiment of the encoder 51. It comprises a series of I shift registers $62_1$, $62_2$, ... $62_I$ which store at a given instant the respective data $a_{k-1}$, $a_{k-2}$, ... $a_{k-I}$ at the command of the clock H. The set of data $a_k$, $a_{k-1}$, ... $a_{k-I}$ is used for addressing a memory 63, for example, a programmable read-only memory (PROM) which performs the encoding of the data $a_k$ into data $b_k$ and $c_k$. These data enter the random access memories $52_1$, $52_2$ respectively, which perform the predistortion of the data $b_k$ into the data $b'_k$ and the data $c_k$ into the data $c'_k$, both in-phase with the symbol clock H. The data $b'_k$ and $c'_k$ are then each introduced into two sets of flip-flops $64_1$, $64_2$ which are controlled, one, $64_1$, by the symbol clock H and the other, $64_2$, by the symbol clock inverted by the inverter 65. Thus the set of flip-flops $64_1$ supplies the data $b'_k$ at the instants kT, that is, $b'_k$(kT) and the set of flip-flops $64_2$ supplies the data $c'_k$ at the instants kT+T/2, that is, $c'_k$(kT+T/2). In order to realize the addition of the data $b'_k$(kT) and $c'_k$(kT+T/2) as shown in FIG. 5, these data are multiplexed in a circuit 53 in order to supploy the digital r(t) so that:

$$r(t) = \Sigma[b'_k \cdot \delta(t-kT) + c'_k \cdot \delta(t-kT-T/2)].$$

This digital signal r(t) passes through a digital-to-analog converter 54 and then through the analog filter 55 preceding the modulator. This filter 55 can also be a digital filter inserted before the digital-to-analog converter 54.

The operation performed by the two sets of flip-flops $64_1$, $64_2$, which generate the data $b'_k$(kT) and $c'_k$(kT+T/2) in-phase and in phase-opposition to the symbol clock, can also be performed before the predistortion circuits $52_1$ and $52_2$. The latter are updated by the respective adaptation circuits $61_1$ and $61_2$ (connecting lines $70_1$ and $70_2$, FIG. 5).

FIG. 7 corresponds with a particular case of the one represented in FIG. 6. In effect, when n=2 in the equation (2) the diagram of FIG. 7 is simplified and then only requires a single shift register $62_1$ which delays the data $a_k$ by a single symbol period. shaping the signals then corresponds with a Nyquist filtering with α=1. The data $a_k$(kT) and the delayed data $a_{k-1}$(kT−T) are added together in the adder 66 which is thus substituted for the read-only memory 63 of FIG. 6 for supplying:

$$b_k(kT) = a_k(kT) + a_{k-1}(kT-T).$$

The predistortion circuit $52_1$ is addressed by the data $b_k$(kT). The predistortion circuit $52_2$ is addressed by the data $2a_k$(kT), the coefficient 2 being programmed in the predistortion circuit $52_2$. The two predistortion circuits $52_1$, $52_2$ are, for example, random access memories RAM which are updated from the respective adaptation circuits $61_1$ and $61_2$ (connection lines $70_1$ and $70_2$, FIG. 5). The output signals of the predistortion circuits $52_1$ and $52_2$ are processed like in the case of FIG. 6 by the respective two sets of flip-flops $64_1$ and $64_2$, then multiplexed by the circuit 53, and thereafter transferred to the digital-to-analog converter 54 and then to the filter 55.

The signal transmitted by the transmitter and subsequently received by a receiver at the other end of the transmission system is to undergo a filtering on reception which is determined so that approximately the filtering at the transmit end associated to the filtering at the receive end corresponds with a Nyquist filtering having an adequate roll-off factor. It is this roll-off factor that determines the protection against the adjacent channel interferences. In order to illustrate the results obtained with the invention let us take, by way of example, a 64-QAM system with 140 Mbits/s operating in a frequency scheme with a 30 MHz channel spacing. For this system a roll-off factor of $\alpha=0.5$ in a Nyquist filtering equally distributed over transmit and receive ends provides a protection of 28 dB. In order to obtain the same protection in the system according to the invention the overall filtering is to have a lower roll-off factor. In this example, the choice of n=2 as the order of the encoding polynomial at the transmit end requires a roll-off factor of 0.25 in the overall filtering in order to attain a protection of 28 dB against the adjacent channels interference.

According to the invention, with a 256-QAM system with $2\times140$ Mbits/s in a frequency scheme with a 40 MHz channel spacing, the gain provided by the invention is approximately 3 dB compared with prior-art predistortion techniques.

I claim:

1. Adaptive predistortion circuit for a digital transmission system which transmits input data at the rate of a symbol clock having a period T with the aid of a modulator and a power amplifier which distorts the data, the circuit comprising:

a predistortion circuit predistorting in the opposite sense the input data prior to their entering the amplifier in order to transmit the expected input data, an adaptation circuit continuously adapting the predistortion circuit to the stream of transmitted data in response to a demodulation of the stream of transmitted data, and a filter performing a signal shaping, characterized in that the circuit comprises an encoder generating, on the basis of digital data $a_k$ (k being an integer):

on a first path, digital data $b_k$ leaving a first predistortion circuit in a predistorted condition, in-phase with the symbol clock, on a second path, digital data $c_k$ leaving a second predistortion circuit in a predistorted condition, in phase-opposition to the symbol clock, the signals $b_k$ and $c_k$ being obtained by means of an n-th order polynomial encoding of the type of $F(D)=(1+D)^n$ where D is a delay of a half symbol period and where F is a function applied to the data $a_k$, these signals having a frequency shaping such that $$F(\omega)=\cos^n(\omega T/4) \text{ for } |\omega|\leq 2\pi/T$$

where n is a positive integer, these signals being encoded such that $$b_k = \sum_{i=0}^{I} C_n^{2i} a_{k-i}$$

$$c_k = \sum_{j=0}^{J} C_n^{2j+1} a_{k-j}$$

where I is the integer part of n/2 and where J is the integer part of (n−1)/2 the coefficients $C_n^{2i}$ and $C_n^{2j+1}$ being the coefficients of Newton's binomial theorem, the predistorted data of the two paths being added together in an adder, then transformed into an analog signal by an digital-to-analog filter, this analog signal being filtered by the filter for obtaining a bandwidth limitation (−1/T, 1/T), then transmitted to the modulator and thereafter to the amplifier, the adaptation being effected after the demodulation of the transmitted data with the aid of two adaptation circuits, one of which operating in-phase with and the other in phase-opposition to the symbol clock for adapting the corresponding predistortion circuit.

2. Adaptive predistortion circuit as claimed in claim 1, characterized in that the encoder comprises a series of I shift registers in which the data $a_{k-1}, a_{k-2} \ldots a_{k-I}$ which are passing are used together with the data $a_k$ for addressing at least one memory which performs the encoding of the data $a_k$ into the data $b_k$ and $c_k$, the predistortion circuits being random access memories delivering the predistorted values to the in-phase and the opposite-phase paths.

3. An adaptive predistortion circuit as claimed in claim 1, characterized in that n=2, for which $b_k=a_k+a_{k-1}$ and $c_k=2a_k$, the encoder comprising a single shift register and an adder for determining $b_k$ which addresses the first predistortion circuit, the data $a_k$ directly addressing the second predistortion circuit, the data delivered by the two predistortion circuits entering two sets of flip-flops operating respectively in-phase and in phase-opposition to the symbol clock.

* * * * *